Jan. 26, 1965 A. G. MUELLER 3,167,689

ELECTRICAL ASSEMBLY

Filed Feb. 20, 1961

INVENTOR.
ARMAND G. MUELLER
BY
William H. Schmeling

3,167,689
ELECTRICAL ASSEMBLY

Armand G. Mueller, Wauwatosa, Wis., assignor to Square D Company, Park Ridge, Ill., a corporation of Michigan Filed Feb. 20, 1961, Ser. No. 90,424
7 Claims. (Cl. 317—100)

This invention relates to encapsulated electrical assemblies and more particularly, to the construction details of the components thereof.

Conventional radio-type components, such as resistors, capacitors, transistors, diodes and the like are frequently employed in logic systems. While the techniques of manufacture have progressed so the components may be considered reliable, the extreme fragility of the components has deterred their use in industrial circuits. Another deterrent to the acceptance of radio-type components in industrial practice is the adverse psychologic effect created in the minds of maintenance personnel. The introduction of electronic circuits in industrial control circuits is of relatively recent origin and when the average maintenance man is requested to service a circuit containing a large number of the above mentioned components, he immediately assumes upon viewing the circuit that the circuit is complicated and incapable of ready repair.

It is therefore an object of the present invention to overcome the objections to the use of radio-type components in industrial installations by providing an assembly, and the method of making the same, wherein advantage is taken of the reliability of the present day radio components and a large number of fragile components are protected and completely concealed so the device may be used in industrial logic circuits and electrical connections thereto may be made in accordance with accepted industrial techniques.

The assembly according to the present invention is characterized by its pleasing, rugged appearance, the ease with which it may be manufactured, and the compact, sturdy arrangement of the otherwise fragile parts prior to encapsulation in a housing.

One form of encapsulation of the electronic components to achieve the rugged appearance and protect the fragile parts encapsulated therein includes the use of a molded insulated housing wherein the electronic components are positioned prior to encapsulation. It is to be appreciated that if these devices are to be used at their maximum electrical ratings without damage thereto, the heat generated within the encapsulated devices must be dissipated from the assembly. The encapsulating material which completely surrounds the devices as well as the external enclosure of the assembly are of insulating material and substantially will prevent heat flow from the devices. Another problem encountered in the manufacture of an encapsulated assembly of electronic devices is the difficulty of supporting the devices prior to and during the encapsulation and providing a support for the terminals of the assembly which are electrically connected to the devices contained within the assembly. The above problems are overcome by the construction according to the present invention wherein a U-shaped channel member positioned on top of the device provides a support for the terminals of the device as well as a support for a heat sink wherein the devices to be cooled are mounted. The channel member in providing the above advantages, also because of its spacing above the surface of the encapsulating material, conceals the surface of the encapsulating material and provides a rugged cap with improved heat transfer characteristics because of the chimney effect achieved by its configuration and location in the assembly.

It is an object therefore of the present invention to provide an improved assembly of encapsulated electronic components wherein the heat generated by the components is efficiently transferred to the exterior of the device.

Another object of the present invention is to provide for efficient transfer of the heat generated by the electronic devices in an encapsulated assembly of the devices with a means which will position the devices prior to encapsulation and provide a support for terminals to the circuit components including the devices encapsulated within the assembly.

A further object of the present invention is to provide an encapsulated assembly which includes a molded receptacle which has an open rectangular cavity with inwardly facing ledges along opposed walls of the cavity and to position on the ledges an assembly which includes a U-shaped metal channel member which supports terminals for the assembly and a second metal member which has secured in heat conducting relation thereto certain electronic devices which are encapsulated within the cavity so that the U-shaped member may radiate heat from the encapsulated devices as well as provide a support for the terminals ot the assembly.

Further objects and features of the invention will be readily apparent to those skilled in the art from the specification and appended drawing illustrating certain preferred embodiments in which.

Figures 1, 2:
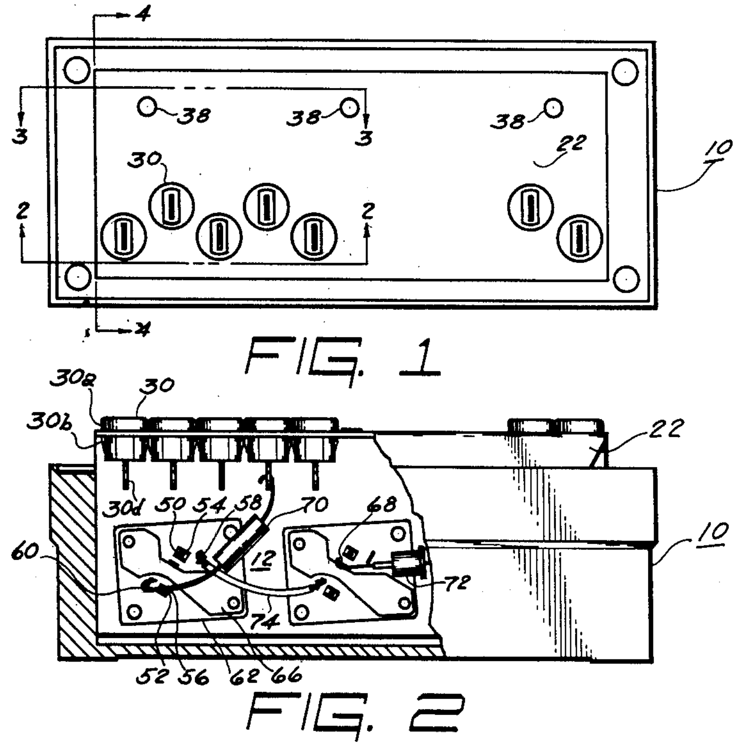
FIG. 1 is a top plan view of an electrical encapsulated assembly incorporating the features of the present invention.
FIG. 2 is a view of one side of the device in FIG. 1 showing a broken-away portion thereof in section generally along line 2—2 in FIG. 1, in the direction of the indicating arrows prior to encapsulation of the device.
Figures 3, 4:
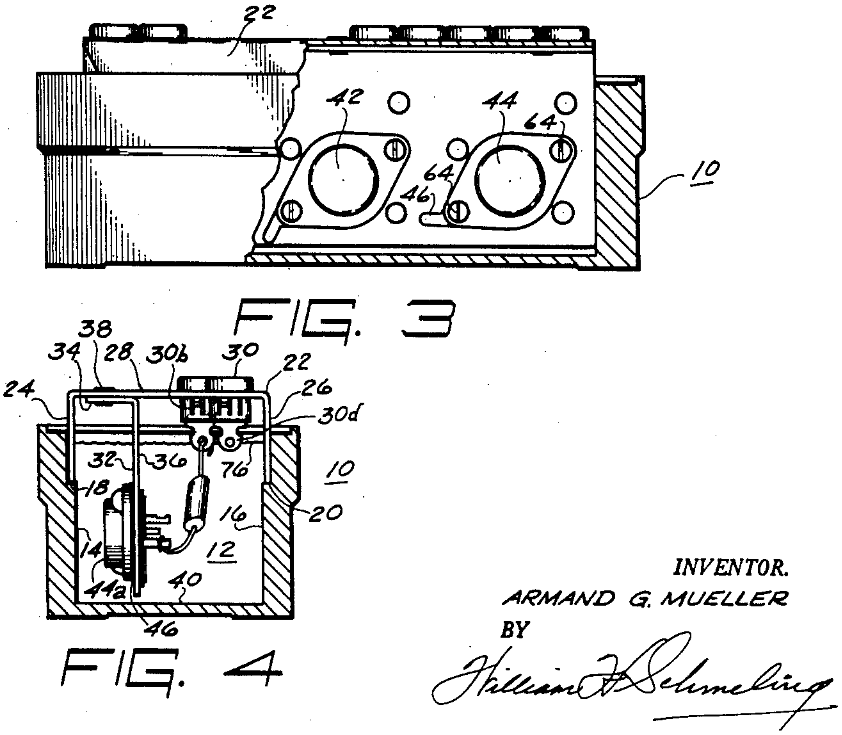
FIG. 3 is a view showing the other side of the device in FIG. 1 with a broken-away portion thereof shown in section generally along line 3—3 in FIG. 1 in the direction of the indicating arrows prior to encapsulation of the device.
FIG. 4 is a sectional view taken along line 4—4 in FIG. 1 after encapsulation of the device.

In the drawings, the numeral 10 designates the receptacle preferably formed of a molded insulating material to have a rectangular solid exterior shape having a cavity 12 which is rectangular in shape and open at the top surface of the receptacle. The cavity 12 has two opposing side walls, indicated by numerals 14 and 16 in FIG. 4, on which inwardly extending ledges 18 and 20 are formed. The receptacle 10 is provided with a cover 22 which is formed of metallic material and is coextensive in size with the opening of cavity 12. The cover 22 has a U-shaped cross section, as shown in FIG. 4, provided by a pair of parallel spaced arms 24 and 26 innerconnected by a bight portion 28. The parallel arms 24 and 26 are spaced and arranged to rest upon the ledges 18 and 20 respectively to position the cover 22 on the receptacle 10. The bight portion 28 of the cover 22 is provided with a plurality of openings, each of which is adapted to receive a terminal member 30. The terminal members 30 per se, do not constitute one of the features of the present invention and are preferably formed of a suitable insulating material, such as nylon, to have an enlarged head portion 30*a* which has a greater diameter than the openings in the bight portion 28 and a pair of extending resilient lugs 30*b*, formed on the downwardly extending portion which passes through the opening in the bight portion 28. The terminals 30 also have a metal portion which extends from the top surface thereof through the body portion to a portion 30*d* which is exposed beneath the bottom surface thereof to permit securement of wires thereto as is apparent from the drawings. The terminals 30 are installed in the openings by merely inserting the same from the top surface of the bight portion 28 so that the lugs 30*b* are deformed and snapped into position in the conventional manner to maintain the terminals in position after assembly thereof with the channel member 22. Extending downwardly from the bight portion 28, intermediate the arms 24 and 26 is a member 32. The member 32, formed of metallic or other heat conducting material, is preferably L-shaped in cross section as provided by a pair of arms 34 and 36 which are disposed at right angles to each other. The arm portion 34 is secured to the bight portion 28 in heat conducting relation therewith. In the embodiment shown, the member 32 is secured to the bight portion 28 by means of rivets 38. The arm portion 36 is sized to be received within the cavity 12 and preferably has a bottom edge disposed in spaced relation to the bottom wall 40 of the cavity 12.

Secured in heat conducting relation on the arm portion 36 are a plurality of semiconductor devices designated by numerals 42 and 44. These semiconductor devices, which do not constitute one of the features of the present invention, are commercialy available and may include transistors, silicon controlled diodes and normal unidirectional conducting diodes, all of which will produce heat upon operation in the circuits in which they are included. The semiconductor devices 42 and 44 may be identical, and therefore only the mounting arrangement for the semiconductor device 44 will be described. The device 44 has an outer metallic case 44*a* which in accordance with conventional practice may be connected to internal portions of the device to provide an electrical connection to one of the electrodes of the device. Interposed between the case 44*a* of device 44 and the arm 36 is an anodized aluminum washer indicated by numeral 46. The anodized coating on the aluminum washer provides the necessary electrical insulation between the arm 36 and the case 44*a* of the device without appreciably reducing the heat transfer connection between the arm 36 and the case 44*a*. The device 44 also has a pair of principal electrodes comprising pins 50 and 52 which extend from the rear face of the device through suitable openings, not shown, in the washer 46 and arm 36. These pins are received in suitable socket members 54 and 56 respectively, which are electrically connected with a pair of terminals 58 and 60 respectively. These terminals 58 and 60 and sockets 54 and 56 are carried on a laminated member 62 of insulating material which is secured in position on the opposed face of the arm 36 from the anodized washer 46 by means of mounting screws 64 which extend through suitable openings in the case 44*a*, the anodized washer 46 and the insulating sheet 62 into threaded openings in a metal member 66 which has a terminal 68 extending therefrom. It is clearly apparent that if the outer case 44*a* is electrically connected to one of the electrodes of the device then a circuit to the electrode connected to case 44*a* is completed to the terminal 68 through the mounting screws 64 and the member 66. In this connection it is also to be pointed out that the arrangement of the insulated sheet 62 and the terminals carried thereby along with the arrangement for mounting the transistor by means of the part 66 and the bolts 64 does not constitute one of the features of the present invention. Also a plurality of other electrical components and terminal leads which per se do not require a high degree of heat transfer are shown in the drawings. These components and leads may be connected between the terminals 60, 58 and 68 and the terminals associated with the terminal members 30 to complete any suitable type of electrical circuit.

During manufacture of the device preferably the terminal members 30 are first secured in the openings in the bight portion 28 as shown. After the above is accomplished, the semiconductor devices are mounted on the arm portion 36 as previously described and the necessary electrical components as for example, a resistor 70 and a diode 72, together with suitable leads 74 are connected between the various electrodes of the devices 42 and 44 and the terminals 30. After the above is accomplished, the member 22 is positioned so that the arm 36 is within the cavity 12 and the arm portions 24 and 26 rest upon the ledges 18 and 20 respectively. When the above is accomplished, a suitable encapsulating material is included within the cavity 12. The encapsulating material does not form one of the features of the present invention and may include any suitable well known material such as an epoxy resin which is injected into the cavity in liquid form and solidifies in response to a catalytic action a predetermined time after the filling is accomplished.

Preferably the encapsulating material is included in the cavity 12 so that the surface 76 thereof partly embeds the portions 30*d* of the terminal members. This arrangement will cause the terminal members 30 and the cover 22 to be securely positioned on the receptacle 10. The encapsulating materials generally employed are insulating materials and have poor heat transfer characteristics. The material forming the receptacle 10 also may be of the insulating type and further limit the transfer of heat from the device within the encapsulated material. It has been found that the heat generated within the semiconductor devices must be dissipated if the devices are to be operated near their rated capacities. The case 44*a* is in heat conducting relation with arm 36 which in turn is connected to the bight portion 28. The metal path and metal to metal contact between these parts causes a rapid transfer of heat from the semiconductor devices to the cover 22. The bight portion 28 is spaced above the surface 76 of the encapsulated material. Thus both sides of the bight portion 28 are exposed to the circulation of air and when the devices are mounted in a vertical position, a chimney effect will occur between the bight portion 28 and the surface 76 to further increase the heat transfer. Also, it is clearly apparent that as the heat is dissipated by the arm portion 36, the encapsulating material adjacent the arm will be cooler than the remainder of the encapsulated material. Thus the transfer of heat from the resistors and diodes not mounted on the arm portion but contained within the encapsulating material will likewise be increased. A further advantage of the arrangement of the bight portion is that it will conceal the somewhat unsightly appearance of the surface 76 of the encapsualted material after the material solidifies.

While certain preferred embodiments of the invention have been specifically disclosed, it is understood that the invention is not limited thereto, as many variations will be readily apparent to those skilled in the art and the invention is to be given its broadest possible interpretation within the terms of the following claims.

What is claimed is:

1. An assembly comprising; a rectangular receptacle formed of insulating material having an open rectangular cavity with inwardly extending ledges formed along opposed side walls thereof, a metal channel member having a U-shaped cross section with spaced parallel arm portions resting on the ledges and a bight portion spaced above the marginal edges of said opposed walls, a second metal member secured to the bight portion and having a portion extending into the cavity, at least one thermo emissive electronic device mounted in heat conducting relation on the extending portion of the metal member within the cavity, a plurality of other electronic components supported by the channel member and second metal member, and an insulating resinous material within the cavity encapsulating the device and other electronic components and securing the metal member in said cavity whereby the metal member and the channel member are maintained in position on the receptacle and serve as heat radiating members for the device.

2. An assembly comprising; a rectangular receptacle formed of insulating material to have an open rectangular cavity with inwardly extending ledges formed along opposed walls of the cavity, a metal channel member having a U-shaped cross section with spaced parallel arm portions resting on the ledges and a bight portion spaced above the top surface of the receptacle and having at least one opening therein, an angle member having a L-shaped cross section having an arm portion secured to the bight portion and a downwardly extending arm portion extending into the cavity, at least one thermo emissive electronic device mounted in heat conducting relationship on the downwardly extending arm portion, a terminal positioned in the opening and electrically connected with the device, and an insulating resinous filling for the cavity encapsulating the device in the cavity and having a top surface partly embedding a portion of the terminal member and spaced from the bight of the channel member whereby both surfaces of the channel member radiate heat transmitted thereto from the device.

3. An assembly comprising; a rectangular receptacle formed of insulating material having an open rectangular cavity with inwardly extending ledges formed along opposed side walls thereof, a metal channel member having a U-shaped cross section with spaced parallel arm portions resting on the ledges and a bight portion connecting the spaced parallel arms having at least one opening therein and spaced above the marginal top edges of the opposed walls, a second metal member having a heat conducting connection with the channel member and having a portion extending downwardly from the bight portion into the cavity, at least one thermo emissive electronic device mounted on the second metal member with a heat conducting connection, at least one terminal member mounted in the opening in the bight portion and electrically connected with the device, and an insulating resinous material within the cavity encapsulating the device and securing the metal member in said cavity whereby the metal member and the channel member are maintained in position on the receptacle and serve as heat radiating members for the device.

4. The combination as set forth in claim 1 wherein the extending portion of the second metal member is substantially of the same length as the ledges for longitudinally positioning the metal member in the cavity.

5. The combination as recited in claim 1 wherein the portion of the second metal member extends substantially parallel and spaced from the opposed side walls.

6. The combination as recited in claim 1 wherein the ledges on the opposed side walls are located below the top surface of the filling material whereby the spaced parallel arms of the channel member are partly embedded in the filling material.

7. The combination as recited in claim 3 wherein the bight portion is provided with a plurality of openings and a plurality of electrical devices are mounted on the second metal member and a plurality of terminal members mounted in the openings are electrically connected to the devices.

References Cited in the file of this patent

UNITED STATES PATENTS

| | | |
|---|---|---|
| 2,343,284 | Dodington | Mar. 7, 1944 |
| 2,555,039 | Bissonette | May 29, 1951 |
| 2,570,017 | Wedig | Oct. 2, 1951 |
| 2,964,057 | Connelly | Dec. 9, 1958 |
| 3,029,367 | Tomonoh et al. | Apr. 10, 1962 |
| 3,065,385 | Mierendort | Nov. 20, 1962 |

OTHER REFERENCES

Davidson, F. J.: "Designing Potted Circuits," pp. 38, 39, Electronic Design for March 1955.

Welsh, J. P.: "Taking the Heat Off Miniature Equipment," pp. 152 to 156, Electronics for October 1956.